(12) United States Patent
Takami et al.

(10) Patent No.: US 8,501,052 B2
(45) Date of Patent: Aug. 6, 2013

(54) THIN FILM COMPRISING TITANIUM OXIDE AS MAIN COMPONENT AND SINTERED COMPACT SPUTTERING TARGET COMPRISING TITANIUM OXIDE AS MAIN COMPONENT

(75) Inventors: Hideo Takami, Ibaraki (JP); Masataka Yahagi, Ibaraki (JP)

(73) Assignee: JX Nippon Mining & Metals Corporatoin, Tokyo (JP)

( * ) Notice: Subject to any disclaimer, the term of this patent is extended or adjusted under 35 U.S.C. 154(b) by 0 days.

(21) Appl. No.: 13/145,641

(22) PCT Filed: Jan. 29, 2010

(86) PCT No.: PCT/JP2010/051232
§ 371 (c)(1),
(2), (4) Date: Aug. 2, 2011

(87) PCT Pub. No.: WO2010/090137
PCT Pub. Date: Aug. 12, 2010

(65) Prior Publication Data
US 2011/0278511 A1    Nov. 17, 2011

(30) Foreign Application Priority Data

Feb. 5, 2009 (JP) ................................. 2009-025064
Apr. 2, 2009 (JP) ................................. 2009-089653

(51) Int. Cl.
| | |
|---|---|
| F21V 9/00 | (2006.01) |
| G02B 5/02 | (2006.01) |
| G02C 7/10 | (2006.01) |
| G02F 1/361 | (2006.01) |
| G03B 11/00 | (2006.01) |
| C23C 14/00 | (2006.01) |
| C23C 14/32 | (2006.01) |

(52) U.S. Cl.
USPC ............. 252/582; 106/286.4; 204/192.15; 204/192.16; 204/298.13

(58) Field of Classification Search
USPC ............. 252/582; 106/286.4; 204/192.15, 204/192.16, 298.13
See application file for complete search history.

(56) References Cited

U.S. PATENT DOCUMENTS

| | | | |
|---|---|---|---|
| 5,681,632 A | 10/1997 | Kitaura et al. | |
| 6,528,442 B1 | 3/2003 | Kuwano et al. | |
| 6,755,948 B1 | 6/2004 | Fukuyo et al. | |
| 2003/0054178 A1 | 3/2003 | Anzaki et al. | |
| 2003/0091500 A1 | 5/2003 | Koinuma et al. | |
| 2010/0276276 A1 | 11/2010 | Takami et al. | |

FOREIGN PATENT DOCUMENTS

| | | |
|---|---|---|
| JP | 07-0233469 A | 9/1995 |
| JP | 11-104500 A | 4/1999 |
| JP | 2000-030297 A | 1/2000 |
| JP | 2002-206164 A | 7/2002 |
| JP | 2006-079710 A | 3/2006 |
| JP | 2006-144052 A | 6/2006 |
| WO | 2009/078306 A1 | 6/2009 |

OTHER PUBLICATIONS

Deng Lu Hou, Rui Bin Zhao, Hai Juan Meng, Li Yun Jia, Xiao Juan Ye, Hong Juan Zhou, Xiu Ling Li,Room-temperature ferromagnetism in Cu-doped TiO2 thin films,Thin Solid Films 516 (2008) 3223-3226, © 2007 Elsevier B.V. All rights reserved.*
Seung Wan Ryua, Eui Jung Kimb, Seung Kook Koa, Sung Hong Hahna, Effect of calcination on the structural and optical properties of M/TiO2 thin films by RF magnetron co-sputtering, Materials Letters 58 (2004) 582-587, D 2003 Elsevier B.V. All rights reserved.*
Gaoling Zhao et al., "Sol-gel Preparation and Photoelectrochemcial Properties of TiO2 Films Containing Au and Ag metal Particles", Elsevier Science S.A., Thin Solid Films, vol. 277, No. 1/2, pp. 147-154, May 1996.
Hiromitsu Kozuka et al., "Preparation of Ag/TiO2 Composite Films by the Sol-Gel Method", Bull. Inst. Chem. Res., Kyoto Univ., vol. 72, No. 2, pp. 209-224, Oct. 1994.
D.L. Hou et al., "Room-Temperature Ferromagnetism in Cu-doped TiO2 Thin Films", Thin Solid Films, vol. 516, pp. 3223-3226, Jul. 2007.
A.K. Pradhan et al., "Ferromagnetism in nanocrystalline Epitaxial Co:TiO2 Thin Films", Applied Physics Letters, vol. 86, pp. 222503-1 to 222503-3, May 2005.
N.H. Hong et al., "Distribution of Dopant in Fe:TiO2 and Ni:TiO2 Thin Films", Journal of Magnetism and Magnetic Materials, vol. 281, pp. 347-352, May 2004.
D. Mardare et al., "Optical Dispersion Analysis of TiO2 Thin Films Based on Variable-Angle Spectroscopic Ellipsometry Measurements", Materials Science & Engineering B, vol. 68, pp. 42-47, 1999 (month unknown).

* cited by examiner

*Primary Examiner* — Bijan Ahvazi
(74) *Attorney, Agent, or Firm* — Howson & Howson LLP

(57) ABSTRACT

A thin film comprising titanium oxide as its main component, wherein the thin film includes titanium, oxygen and copper, content of Ti is 29.0 at % or higher and 34.0 at % or less and content of Cu is 0.003 at % or higher and 7.7 at % or less with remainder being oxygen and unavoidable impurities, and ratio of oxygen component to metal components, O/(2Ti+0.5Cu), is 0.96 or higher. This invention aims to obtain a thin film comprising titanium oxide as its main component with a high refractive index and low extinction coefficient and a sintered compact sputtering target comprising titanium oxide as its main component which is suitable for producing the foregoing thin film, to obtain a thin film with superior transmittance and low reflectance and which is effective as an interference film or protective film of an optical information recording medium, and to obtain a thin film that can be applied to a glass substrate; that is, a thin film that can be used as a heat ray reflective film, antireflection film, and interference filter.

9 Claims, No Drawings

THIN FILM COMPRISING TITANIUM OXIDE AS MAIN COMPONENT AND SINTERED COMPACT SPUTTERING TARGET COMPRISING TITANIUM OXIDE AS MAIN COMPONENT

BACKGROUND OF THE INVENTION

The present invention relates to a thin film comprising titanium oxide as its main component with a high refractive index and low extinction coefficient and a sintered compact sputtering target comprising titanium oxide as its main component which is suitable for producing the foregoing thin film.

In recent years, technology of high density recording optical disks, which are high density optical information recording mediums capable of rewriting without using a magnetic head, has been developed, and these optical disks are being commercialized at a rapid rate. In particular, ever since its appearance in 1977 as a rewritable CD, CD-RW is the most popular phase-change optical disk. The rewrite cycle of a CD-RW is approximately 1000 times.

Moreover, DVD-RW for use as a DVD has been developed and commercialized, and the layer structure of this disk is basically the same as or similar to a CD-RW. The rewrite cycle of a DVD-RW is approximately 1000 to 10000 times.

These are electronic parts that record, reproduce and rewrite information by irradiating a laser beam and optically changing the transmittance, reflectance and the like of the recording material, and have spread rapidly.

Generally speaking, a phase-change optical disk used as a CD-RW, a DVD-RW or the like has a four-layer structure in which both sides of a recording thin film layer based on Ag—In—Sb—Te, Ge—Sb—Te or the like with a high melting point dielectric protective layer made of ZnS, $SiO_2$ or the like, and which is additionally provided with a silver or silver alloy or aluminum alloy reflective film. Moreover, in order to increase the rewrite cycle, an interface layer is added between a memory layer and a protective layer as needed.

A reflective layer and a protective layer are demanded of optical functions of increasing the difference of reflectance between the amorphous part and crystal part of the recording layer, and additionally demanded of humidity resistance of the recording thin film and a function for preventing deformation caused by heat, and a function of controlling the thermal conditions upon recording (refer to Non-Patent Document 1).

Recently, a single-sided, dual layer optical recording medium has been proposed to realize larger capacity and higher density, (refer to Patent Document 1). In Patent Document 1, there is a first information layer formed on a substrate 1 and a second information layer formed on a substrate 2 from the incident direction of the laser beam, and these layers are affixed to each other with an intermediate layer interposed therebetween so that the information films face each other.

In the foregoing case, the first information layer is configured from a recording layer and a first metal reflective layer, and the second information layer is configured from a first protective layer, a second protective layer, a recording layer, and a second metal reflective layer. In addition, layers such as a hard coat layer and a thermal diffusion layer may be arbitrarily formed for protection against scratches, contamination and the like. Moreover, various materials have been proposed as the protective layer, recording layer, reflective layer and other layers.

A high melting point dielectric protective layer requires tolerance against repeated thermal stress by warming and cooling, requires the thermal effect not to affect the reflective film or other locations, needs to be thin with low reflectance, and requires strength that is free from deterioration. In this respect, the dielectric protective layer plays an important role. The recording layer, reflective layer, interference film layer and the like are similarly important in that they exhibit their functions respectively in the foregoing electronic parts such as CDs and DVDs.

The respective thin films with the foregoing multilayer structure are normally formed with the sputtering method. The principal of the sputtering method is as follows; specifically, the sputtering method causes a substrate and a target as a positive electrode and a negative electrode to face each other, and applies a high voltage between the substrate and the target under an inert gas atmosphere in order to generate an electric field. Here, the ionized electrons and inert gas collide and form plasma, the positive ions in the plasma collide with the target (negative electrode) surface and sputter the atoms configuring the target, and the sputtered atoms adhere to the opposing substrate surface so as to form a film.

In the foregoing circumstances, a target using titanium oxide ($TiO_x$) has been proposed as a sputtering target for forming a heat ray reflective film and an antireflection film (refer to Patent Document 2). Here, the specific resistance value is set to 0.35 $\Omega$cm or less to stabilize the discharge during sputtering. Consequently, DC sputtering is enabled and a film with a high refractive index can be obtained.

Here, the transmittance of the film will deteriorate, so the oxygen content is set to be 35 wt % or higher, and measures for introducing oxygen are additionally adopted. And, since the deposition rate will deteriorate due to the introduction of oxygen, a metal oxide is added to improve the deposition rate. However, there are problems in applying the target of Patent Document 2 to precision optical members and electronic parts that require films with a high refractive index and low absorption. Particularly on the short-wave length side in the vicinity of 400 nm is considered problematic.

[Patent Document 1] Japanese Published Unexamined Patent Application No. 2006-79710
[Patent Document 2] Japanese Patent No. 3836163
[Non-Patent Document 1] Technical Journal "Kogaku" Volume 26, Issue 1, Pages 9-15

SUMMARY OF THE INVENTION

In light of the foregoing problems, an object of this invention is to provide a thin film comprising titanium oxide as its main component with a high refractive index and low extinction coefficient and a sintered compact sputtering target comprising titanium oxide as its main component which is suitable for producing the foregoing thin film, and simultaneously provide a thin film with superior transmittance and low reflectance and which is effective as an interference film or protective film of an optical information recording medium. Moreover, the thin film of the present invention can also be applied to a glass substrate; that is, the thin film that can also be used as a heat ray reflective film, antireflection film, and interference filter.

In order to achieve the foregoing object, as a result of intense study, the present inventors discovered that the addition of metal such as copper and platinum to titanium oxide is extremely effective in order to obtain a material capable of maintaining transmittance and preventing deterioration of reflectance without impairing the characteristics of an interference film or a protective film of an optical information recording medium.

Based on the foregoing discovery, the present invention provides:

1) A thin film comprising titanium oxide as its main component, wherein the thin film includes titanium, oxygen and copper, content of Ti is 29.0 at % or higher and 34.0 at % or less and content of Cu is 0.003 at % or higher and 7.7 at % or less with remainder being oxygen and unavoidable impurities, and ratio of oxygen component to metal components, O/(2Ti+0.5Cu), is 0.96 or higher;

2) A thin film comprising titanium oxide as its main component, wherein the thin film includes titanium, oxygen and platinum, content of Ti is 29.0 at % or higher and 34.0 at % or less and content of Pt is 0.003 at % or higher and 5.7 at % or less with remainder being oxygen and unavoidable impurities, and ratio of oxygen component to metal components, O/(2Ti+Pt), is 0.95 or higher;

3) A thin film comprising titanium oxide as its main component, wherein the thin film includes titanium, oxygen and one or more types of metal M selected from cobalt, nickel, palladium and gold, content of Ti is 29.0 at % or higher and 34.0 at % or less and content of M is 0.003 at % or higher and 7.7 at % or less with remainder being oxygen and unavoidable impurities, and ratio of oxygen component to metal components, O/(2Ti+M), is 0.95 or higher;

4) The thin film comprising titanium oxide as its main component according to any one of 1) to 3) above, wherein a refractive index in a wavelength region of 400 to 410 nm is 2.60 or higher;

5) The thin film comprising titanium oxide as its main component according to any one of 1) to 4) above, wherein an extinction coefficient in the wavelength region of 400 to 410 nm is 0.1 or less;

6) The thin film comprising titanium oxide as its main component according to 5) above, wherein the extinction coefficient in the wavelength region of 400 to 410 nm is 0.05 or less;

7) The thin film comprising titanium oxide as its main component according to any one of 1) to 6) above, wherein the thin film is used as an optical interference film or a protective film; and 8) The thin film comprising titanium oxide as its main component according to any one of 1) to 6) above, wherein the thin film is used as an optical recording medium.

The present invention additionally provides:

9) A sintered compact sputtering target comprising titanium oxide as its main component, wherein the target includes copper and comprises, as its main component, titanium oxide made of titanium, oxygen and unavoidable impurities as a remainder thereof, the respective components have a composition ratio of $(TiO_{2-m})_{1-n}Cu_n$ (provided that $0 \leq m \leq 0.5$ and $0.0001 \leq n \leq 0.2$), and the target has a specific resistance of 100 Ωcm or less;

10) A sintered compact sputtering target comprising titanium oxide as its main component, wherein the target includes platinum and comprises, as its main component, titanium oxide made of titanium, oxygen and unavoidable impurities as a remainder thereof, the respective components have a composition ratio of $(TiO2-m)_{1-n}Pt_n$ (provided that $0 \leq m \leq 0.5$ and $0.0001 \leq n \leq 0.15$), and the target has a specific resistance of 100 Ωcm or less; and 11) A sintered compact sputtering target comprising titanium oxide as its main component, wherein the target includes one or more types of metal M selected from cobalt, nickel, palladium and gold and comprises, as its main component, titanium oxide made of titanium, oxygen and unavoidable impurities as a remainder thereof, the respective components have a composition ratio of $(TiO_{2-m})_{1-n}M_n$ (provided that $0 \leq m \leq 0.5$ and $0.0001 \leq n \leq 0.2$), and the target has a specific resistance of 100 Ωcm or less.

As described above, the present invention provides a thin film comprising titanium oxide as its main component with a high refractive index and low extinction coefficient and a sintered compact sputtering target comprising titanium oxide as its main component which is suitable for producing the foregoing thin film, and the thin film obtained with the present invention yields a significant effect as a film or layer of an optical information recording medium. Moreover, the thin film of the present invention simultaneously yields superior transmittance and low reflectance and is particularly effective as an interference film or protective film of an optical information recording medium.

A high melting point dielectric protective layer requires tolerance against repeated thermal stress by warming and cooling, and the foregoing thermal effect must not affect the reflective film or other locations, needs to be thin with low reflectance, and requires strength that is free from deterioration. The thin film comprising titanium oxide as its main component of the present invention comprises characteristics that can be applied to this kind of material.

Moreover, since the oxygen amount during sputtering can be adjusted within a small range, there is an additional effect of being able to inhibit the deterioration of the deposition rate.

DETAILED DESCRIPTION OF THE INVENTION

As described above, the thin film comprising titanium oxide as its main component according to the present invention includes, in addition to titanium and O components, copper or platinum or one or more types of metal M selected from cobalt, nickel, palladium and gold. In the case of including copper, the thin film comprising titanium oxide as its main component has a composition ratio where content of Ti is 29.0% or higher and 34.0 at % or less and content of Cu is 0.003 at % or higher and 7.7 at % or less with the remainder being oxygen and unavoidable impurities, and ratio of oxygen component to metal components, O/(2Ti+0.5Cu), is 0.96 or higher. Moreover, in the case of including platinum, the thin film comprising titanium oxide as its main component has a composition ratio where content of Ti is 29.0% or higher and 34.0 at % or less and content of Pt is 0.003 at % or higher and 5.7 at % or less with the remainder being oxygen and unavoidable impurities, and ratio of oxygen component to metal components, O/(2Ti+Pt), is 0.95 or higher. Furthermore, in the case of including one or more types of metal M selected from cobalt, nickel, palladium and gold, the thin film comprising titanium oxide as its main component has a composition ratio where content of Ti is 29.0% or higher and 34.0 at % or less and content of M is 0.003 at % or higher and 7.7 at % or less with the remainder being oxygen and unavoidable impurities, and ratio of oxygen component to metal components, O/(2Ti+M), is 0.95 or higher.

The existence of copper or platinum or one or more types of metal M selected from cobalt, nickel, palladium and gold yields the effect of increasing the refractive index of the thin film. If the content is less than 0.003, the addition effect is small, and if the content exceeds 7.7 at % (cases of adding copper or one or more types of metal M selected from cobalt, nickel, palladium and gold) or 5.7 at % (case of adding platinum), the extinction coefficient of the thin film tends to increase. Thus, it could be said that the abundance of copper or platinum or one or more types of metal M in the thin film is preferably 0.003 at % or higher and 7.7 at % or less (5.7 at % in the latter case).

Although the reason that the refractive index increases is not necessarily clear, the cause is considered to be because copper or platinum or one or more types of metal M selected from cobalt, nickel, palladium and gold are dispersed as fine particles (nano particles, for instance) in the titanium oxide amorphous film.

In certain cases, a part of these added metals exist as metal oxide, but even in cases where they partially exist as an oxide, there is no particular problem, and the improvement in the refractive index is similarly acknowledged. The material with a high refractive index obtained as described above is an even more favorable material since the freedom of designing a multilayer optical film can be improved.

These thin films are amorphous films, and it is possible to obtain a film with a refractive index of 2.60 or higher in a wavelength region of 400 to 410 nm. Moreover, it is also possible to obtain a thin film with an extinction coefficient of 0.1 or less, and even a thin film with an extinction coefficient of 0.05 or less in a wavelength region of 400 to 410.

The foregoing wavelength range of 400 to 410 nm is that of a blue laser, and the refractive index is 2.60 or higher in this wavelength range as described above, but higher the refractive index, the better it is. Moreover, although it is possible to achieve an extinction coefficient of 0.1 or less, and even 0.05 or less, the lower the extinction coefficient, the more suitable it is for multi-layering. This thin film comprising titanium oxide as its main component is effective as an interference film or a protective film, and is particularly effective as an optical recording medium.

The foregoing thin film can be produced by using a sintered compact sputtering target comprising titanium oxide as its main component, wherein the target includes copper or one or more types of metal M selected from cobalt, nickel, palladium and gold and comprises, as its main component, titanium oxide made of titanium, oxygen and unavoidable impurities as a remainder thereof, the respective components have a composition ratio of $(TiO_{2-m})_{1-n}M_n$ (provided that $0 \leq m \leq 0.5$ and $0.0001 \leq n \leq 0.2$), and the target has a specific resistance of 100 Ωcm or less. The foregoing thin film can also be produced by using a sintered compact sputtering target comprising titanium oxide as its main component, wherein the target includes platinum and comprises, as its main component, titanium oxide made of titanium, oxygen and unavoidable impurities as a remainder thereof, the respective components have a composition ratio of $(TiO_{2-m})_{1-n}Pt_n$ (provided that $0 \leq m \leq 0.5$ and $0.0001 \leq n \leq 0.15$), and the target has a specific resistance of 100 Ωcm or less.

With the sputtering in the foregoing case, it is possible to obtain a thin film comprising titanium oxide as its main component with a low extinction coefficient by making adjustments so that oxygen is introduced in the sputtering gas especially in cases where the amount of added metal is large.

The sintered compact target of the present invention has a similar component composition as the thin film, but not the same. Specifically, the basic components of the target include Ti, added metal (Cu, Pt, Co, Ni, Pd and Au), and O component, and the respective components have the foregoing composition ratio. Moreover, this target comprises a specific resistance of 100 Ωcm or less.

In the foregoing case, m is preferably 0.5 or less for this reason: if m exceeds 0.5, the oxygen deficiency increases excessively and the extinction coefficient tends to increase. Moreover, n is preferably 0.0001 or higher and 0.2 (provided that this is 0.15 in the case of Pt) or less for this reason: if n is less than 0.0001, the addition effect of Cu, Pt, Co, Ni, Pd, Au is small, and if n exceeds 0.2 (provided that this is 0.15 in the case of Pt), the extinction coefficient tends to increase in the foregoing deposition. The conductivity of the target is required in order to increase the sputtering efficiency, and the target of the present invention comprises these conditions and can be subject to DC sputtering. Since the Cu, Pt, Co, Ni, Pd, Au phases existing in the sintered compact sputtering target are able to exhibit effects of preventing an abnormal discharge if they are uniformly dispersed as fine grains, it could be said that their average particle diameter is preferably 20 μm or less. By using this sintered compact sputtering target and sputtering it in an argon gas atmosphere containing 0.1 to 16% of oxygen, it is possible to form a titanium oxide thin film containing Cu, Pt, Co, Ni, Pd, Au and/or the oxides of these metals on a substrate.

Upon producing the thin film, a sintered compact sputtering target having the foregoing composition ratio and a specific resistance of 100 Ωcm or less can be used and sputtered in an argon gas atmosphere containing 0.1 to 16% of oxygen.

Specifically, it is thereby possible to form a thin film comprising titanium oxide as its main component, wherein the thin film includes titanium, oxygen and copper, content of Ti is 29.0 at % or higher and 34.0 at % or less and content of Cu is 0.003 at % or higher and 7.7 at % or less with remainder being oxygen and unavoidable impurities, and ratio of oxygen component to metal components, $O/(2Ti+0.5Cu)$, is 0.96 or higher, or a thin film comprising titanium oxide as its main component, wherein the thin film includes titanium, oxygen and platinum, content of Ti is 29.0 at % or higher and 34.0 at % or less and content of Pt is 0.003 at % or higher and 5.7 at % or less with remainder being oxygen and unavoidable impurities, and ratio of oxygen component to metal components, $O/(2Ti+Pt)$, is 0.95 or higher, or a thin film comprising titanium oxide as its main component, wherein the thin film includes titanium, oxygen and one or more types of metal M selected from cobalt, nickel, palladium and gold, content of Ti is 29.0 at % or higher and 34.0 at % or less and content of M is 0.003 at % or higher and 7.7 at % or less with remainder being oxygen and unavoidable impurities, and ratio of oxygen component to metal components, $O/(2Ti+M)$, is 0.95 or higher. Here, the thin film can be formed with DC sputtering.

Upon producing the target, as the raw material, preferably used is high purity (normally 4N or higher) powder of titanium oxide ($TiO_2$) with an average particle diameter of 10 μm or less and high purity (normally 3N or higher) powder of copper or platinum or one or more types of metal M selected from cobalt, nickel, palladium and gold with an average particle diameter of 20 μm or less. These are blended to achieve the composition ratio of the present invention.

Then, the added metals that were selected are mixed so as to be uniformly dispersed in the titanium oxide powder using a wet ball mill or a dry blender (mixer).

After the mixing, the mixed powder is filled in a carbon die and subsequently subject to hot press. The hot press conditions may be changed depending on the composition component, but normally the hot press is performed within a range of 800 to 1100° C. and bearing of 100 to 500 kgf/cm². Nevertheless, these conditions are representative conditions, and the selection thereof is arbitrarily and there is no particular limitation. After sintering, the sintered compact is machined and finished into a target shape.

It is thereby possible to obtain a target in which the basic components are titanium, copper or platinum or one or more types of metal M selected from cobalt, nickel, palladium and gold, and oxygen component. With this target, the respective components have the foregoing composition ratio, and copper or platinum or one or more types of metal M selected from cobalt, nickel, palladium and gold and/or the oxides thereof are dispersed as fine particles in the matrix of the titanium oxide.

EXAMPLES

The present invention is now explained with reference to the Examples and Comparative Examples. Note that these Examples are merely illustrative, and the present invention shall in no way be limited thereby. In other words, various modifications and other embodiments are covered by the present invention, and the present invention is limited only by the scope of its claims.

Examples 1 to 8

As the raw materials, titanium oxide ($TiO_2$) with an average particle diameter of 3 μm and purity of 4N (99.99%), and copper powder with an average particle diameter of 15 μm and purity of 3N (99.9%) were used. These were blended and mixed to achieve the target compositions shown in Table 1.

1 kg of this mixed powder was mixed using a wet ball mill so that copper is uniformly dispersed in the titanium oxide powder. Subsequently, the mixed powder that was dried by vaporizing moisture was filled in a carbon die and hot pressed. The hot press conditions were 970° C., and bearing of 200 kgf/$cm^2$.

The obtained sintered compact was machined to obtain a target of φ152 mm and 5 mmt. Consequently, targets with density of 97% or higher and specific resistance of 0.01 to 10 Ωcm as shown in Table 1 were obtained. There was no abnormal discharge during the sputtering. The results are shown in Table 1.

Subsequently, the sputtering target produced as described above was used to form a sputtered film on a glass substrate. There sputtering conditions were, as shown in Table 1: DC sputtering was performed in an Ar gas atmosphere or Ar gas-$O_2$ (2 to 10%) gas atmosphere and at a gas pressure of 0.5 Pa, gas flow rate of 50 sccm, and sputtering power of 500 to 1000 w.

Consequently, it was possible to perform DC sputtering without any problem, and it was confirmed that the target possesses conductivity.

A 1 μm sputtered film was formed on the glass substrate. In Table 1, the deposition rate and composition of the film analyzed with EPMA (SIMS in a low Cu concentration region) are respectively shown. Amount of 0 is the remainder of Ti and Cu. As Table 1 shows, O/(2Ti+0.5Cu) was 0.96 to 1.00. The refractive index and extinction coefficient of the sputtered film were measured. They were measured with an ellipsometer using a light wavelength of 405 nm. The results are similarly shown in Table 1.

Consequently, the refractive index was high at 2.6 to 2.68, and the extinction coefficient decreased at 0.005 to 0.08. In all cases it was possible to form an interference film or a protective film suitable for an optical recording medium.

Comparative Examples 1 to 5

As the raw materials, titanium oxide ($TiO_2$) with an average particle diameter of 3 μm and purity of 4N (99.99%), and copper powder with an average particle diameter of 15 μm and purity of 3N (99.9%) were used. These were blended and mixed to achieve the target compositions shown in Table 1. Note that Comparative Example 1 shows a case of not adding copper powder.

1 kg of this mixed powder was mixed using a wet ball mill so that copper is uniformly dispersed in the titanium oxide powder. Subsequently, the mixed powder that was dried by vaporizing moisture was filled in a carbon die and hot pressed. The hot press conditions were 970° C., and bearing of 200 kgf/$cm^2$.

The obtained sintered compact was machined to obtain a target of φ152 mm and 5 mmt. Consequently, the density was 95 to 98%. As shown in Table 1, the specific resistance of the target was >100 Ωcm to 0.0005 Ωcm.

TABLE 1

| | | | | deposition | | | | Film Composition | | |
| | composition of target | specific resistance | sputter gas | speed (Å/sec/kW) | Ti (at %) | Cu (at %) | O (at %) | O/(2Ti + 0.5Cu) | refractive index | extinction coefficient |
|---|---|---|---|---|---|---|---|---|---|---|
| Example 1 | $TiO_2$:Cu = 90:10 at % | 0.8 Ωcm | Ar—4%$O_2$ | 0.7 | 32 | 3.5 | 64.5 | 0.98 | 2.65 | 0.02 |
| Example 2 | $TiO_2$:Cu = 95:5 at % | 3 Ωcm | Ar—2%$O_2$ | 1 | 32.8 | 1.7 | 65.5 | 0.99 | 2.64 | 0.01 |
| Example 3 | $TiO_2$:Cu = 99:1 at % | 7 Ωcm | Ar—2%$O_2$ | 0.9 | 33.1 | 0.4 | 66.5 | 1.00 | 2.62 | 0.007 |
| Example 4 | $TiO_2$:Cu = 99:1 at % | 7 Ωcm | Ar | 1.7 | 33.4 | 0.4 | 66.2 | 0.99 | 2.66 | 0.03 |
| Example 5 | $TiO_2$:Cu = 99.9:0.1 at % | 10 Ωcm | Ar | 1.6 | 33.3 | 0.04 | 66.66 | 1.00 | 2.62 | 0.006 |
| Example 6 | $TiO_{1.5}$:Cu = 99:1 at % | 0.01 Ωcm | Ar—10%$O_2$ | 0.4 | 33.9 | 0.4 | 65.7 | 0.97 | 2.61 | 0.08 |
| Example 7 | $TiO_2$:Cu = 80:20 at % | 0.03 Ωcm | Ar—10%$O_2$ | 0.5 | 30.5 | 7.6 | 61.9 | 0.96 | 2.68 | 0.01 |
| Example 8 | $TiO_{1.5}$:Cu = 99.99:0.01 at % | 10 Ωcm | Ar | 1.6 | 33.3 | 0.003 | 66.697 | 1.00 | 2.6 | 0.005 |
| Comparative Example 1 | $TiO_2$ = 100% | >100 Ωcm | Ar—2%$O_2$ | 0.9 | 33.2 | 0 | 66.8 | 1.01 | 2.59 | 0.004 |
| Comparative Example 2 | $TiO_2$:Cu = 99:5 at % | 3 Ωcm | Ar | 1.8 | 33.5 | 1.8 | 64.7 | 0.95 | 2.7 | 0.2 |
| Comparative Example 3 | $TiO_2$:Cu = 70:30 at % | 0.0005 Ωcm | Ar—10%$O_2$ | 0.5 | 29 | 12.3 | 58.7 | 0.92 | 2.61 | 0.2 |
| Comparative Example 4 | $TiO_2$:Cu = 99.995:0.005 at % | 20 Ωcm | Ar | 1.6 | 33.3 | 0.002 | 66.698 | 1.00 | 2.59 | 0.005 |
| Comparative Example 5 | $TiO_{1.5}$:Cu = 99:1 at % | 0.01 Ωcm | Ar | 1.5 | 39.5 | 0.4 | 60.1 | 0.76 | 2.55 | 0.5 |

Subsequently, the sputtering target produced as described above was used to form a sputtered film on a glass substrate. There sputtering conditions were, as shown in Table 1: DC sputtering was performed in an Ar gas atmosphere or Ar gas-$O_2$ (2 to 10%) gas atmosphere and at a gas pressure of 0.5 Pa, gas flow rate of 50 sccm, and sputtering power of 500 to 1000 w.

A 1 μm sputtered film was formed on the glass substrate. The deposition rate and composition of the film analyzed with EPMA (SIMS in a low Cu concentration region) are respectively shown in Table 1. As Table 1 shows, O/(2Ti+0.5Cu) was 0.76 to 1.00. The refractive index and extinction coefficient of the sputtered film were measured. They were measured with an ellipsometer using a light wavelength of 405 nm. The results are similarly shown in Table 1.

Comparative Example 1 is a titanium oxide target to which Cu was not added. Although the extinction coefficient was low at 0.004, the refractive index decreased to 2.59. Thus, it was inadequate as an interference film or a protective film of an optical recording medium. Comparative Example 2 did not satisfy the conditions of the present invention since the ratio of oxygen component to metal components, O/(2Ti+0.5Cu) was 0.95. Here, although the refractive index was high at 2.7, the extinction coefficient contrarily increased to 0.2. Thus, it was inadequate as an interference film or a protective film of an optical recording medium. Comparative Example 3 did not satisfy the conditions of the present invention since the Cu amount was too great and the ratio of oxygen component to metal components, O/(2Ti+0.5Cu) was 0.92. Here, although the refractive index was high at 2.61, the extinction coefficient contrarily increased to 0.2. Thus, it was inadequate as an interference film or a protective film of an optical recording medium.

Comparative Example 4 did not satisfy the conditions of the present invention since the Cu amount was small at 0.002 at %. Here, although the extinction coefficient decreased to 0.005, the refractive index was contrarily low at 2.59. Thus, it was inadequate as an interference film or a protective film of an optical recording medium.

Comparative Example 5 did not satisfy the conditions of the present invention since the ratio of oxygen component to metal component, O/(2Ti+0.5Cu) was low at 0.76. Here, the refractive index was low at 2.55, and the extinction coefficient also increased to 0.5. Thus, it was inadequate as an interference film or a protective film of an optical recording medium.

Example 9 to Example 15

As the raw materials, titanium oxide ($TiO_2$) with an average particle diameter of 3 μm and purity of 4N (99.99%), and palladium (Pd) powder with an average particle diameter of 25 μm and purity of 3N (99.9%) were used. These were blended and mixed to achieve the target compositions shown in Table 2.

1 kg of this mixed powder was mixed using a wet ball mill so that Pd is uniformly dispersed in the titanium oxide powder. Subsequently, the mixed powder that was dried by vaporizing moisture was filled in a carbon die and hot pressed. The hot press conditions were 970° C., and bearing of 200 kgf/$cm^2$.

The obtained sintered compact was machined to obtain a target of ϕ152 mm and 5 mmt. Consequently, targets with density of 95% or higher and specific resistance of 0.01 to 30 Ωcm as shown in Table 2 were obtained.

TABLE 2

| | composition of target | specific resistance | sputter gas | Film Composition | | | | | | |
|---|---|---|---|---|---|---|---|---|---|---|
| | | | | deposition speed (Å/sec/kW) | Ti (at %) | Pd (at %) | O (at %) | O/(2Ti + Pd) | refractive index | extinction coefficient |
| Example 9 | TiO2:Pd = 90:10 at % | 9 Ωcm | Ar—4%O2 | 0.7 | 31.9 | 3.6 | 64.5 | 0.96 | 2.65 | 0.05 |
| Example 10 | TiO2:Pd = 95:5 at % | 20 Ωcm | Ar—2%O2 | 1.1 | 32.7 | 1.7 | 65.6 | 0.98 | 2.62 | 0.05 |
| Example 11 | TiO2:Pd = 99:1 at % | 30 Ωcm | Ar—2%O2 | 0.9 | 33.1 | 0.4 | 66.5 | 1.00 | 2.61 | 0.01 |
| Example 12 | TiO2:Pd = 99.9:0.1 at % | 6 Ωcm | Ar | 1.6 | 33.2 | 0.04 | 66.76 | 1.00 | 2.60 | 0.008 |
| Example 13 | TiO1.5:Pd = 95:5 at % | 0.01 Ωcm | Ar—10%O2 | 0.5 | 33 | 2.1 | 64.9 | 0.95 | 2.65 | 0.07 |
| Example 14 | TiO2:Pd = 80:20 at % | 0.3 Ωcm | Ar—10%O2 | 0.5 | 29.6 | 7.4 | 63 | 0.95 | 2.68 | 0.1 |
| Example 15 | TiO1.9:Pd = 99.99:0.01 at % | 0.05 Ωcm | Ar—1%O2 | 1.3 | 33.3 | 0.004 | 66.696 | 1.00 | 2.65 | 0.009 |
| Comparative Example 6 | TiO2:Pd = 95:5 at % | 20 Ωcm | Ar | 1.8 | 33.5 | 1.8 | 64.7 | 0.94 | 2.68 | 0.19 |
| Comparative Example 7 | TiO2:Pd = 70:30 at % | 0.001 Ωcm | Ar—20%O2 | 0.3 | 28.5 | 12.5 | 59 | 0.85 | 2.54 | 0.3 |

Subsequently, the sputtering target produced as described above was used to form a sputtered film on a glass substrate. There sputtering conditions were, as shown in Table 2: DC sputtering was performed in an Ar gas atmosphere or Ar gas-$O_2$ (1 to 10%) gas atmosphere and at a gas pressure of 0.5 Pa, gas flow rate of 50 sccm, and sputtering power of 500 to 1000 w.

It was possible to perform DC sputtering without any problem, and it was confirmed that the target possesses conductivity.

A 1 μm sputtered film was formed on the glass substrate. The deposition rate and composition of the film analyzed with EPMA are respectively shown in Table 2. As Table 2 shows, O/(2Ti+Pd) was 0.95 to 1.00. The refractive index and extinction coefficient of the sputtered film were measured. They were measured with an ellipsometer using a light wavelength of 405 nm. The results are similarly shown in Table 2.

Consequently, the refractive index was high at 2.60 to 2.68, and the extinction coefficient decreased at 0.008 to 0.1. In all cases, it was possible to form an interference film or a protective film suitable for an optical recording medium.

Comparative Example 6 and Comparative Example 7

As the raw materials, titanium oxide ($TiO_2$) with an average particle diameter of 3 μm and purity of 4N (99.99%), and palladium (Pd) powder with an average particle diameter of 25 μm and purity of 3N (99.9%) were used. These were blended and mixed to achieve the target compositions shown in Table 2.

1 kg of this mixed powder was mixed using a wet ball mill so that Pd is uniformly dispersed in the titanium oxide powder. Subsequently, the mixed powder that was dried by vaporizing moisture was filled in a carbon die and hot pressed. The hot press conditions were 970° C., and bearing of 200 kgf/$cm^2$.

The obtained sintered compact was machined to obtain a target of ϕ152 mm and 5 mmt. Consequently, the density was 95% or higher. As shown in Table 2, the specific resistance of the target was 0.001 Ωcm to 20 Ωcm.

Subsequently, the sputtering target produced as described above was used to form a sputtered film on a glass substrate. There sputtering conditions were, as shown in Table 2: DC sputtering was performed in an Ar gas atmosphere or Ar gas-$O_2$ (20%) gas atmosphere and at a gas pressure of 0.5 Pa, gas flow rate of 50 sccm, and sputtering power of 500 to 1000 w.

A 1 μm sputtered film was formed on the glass substrate. The deposition rate and composition of the film analyzed with EPMA are respectively shown in Table 2. As Table 2 shows, O/(2Ti+Pd) was 0.85 to 0.94. The refractive index and extinction coefficient of the sputtered film were measured. They were measured with an ellipsometer using a light wavelength of 405 nm. The results are similarly shown in Table 2.

As a result of the above, Comparative Example 6 did not satisfy the conditions of the present invention since the ratio of oxygen component to metal components, O/(2Ti+Pd) was 0.94. Here, although the refractive index was high at 2.68, the extinction coefficient contrarily increased to 0.19. Thus, it was inadequate as an interference film or a protective film of an optical recording medium.

Comparative Example 7 did not satisfy the conditions of the present invention since the Pd amount was too great at 12.5 at % and the ratio of oxygen component to metal components, O/(2Ti+Pd) was 0.85. Here, the refractive index was low at 2.54, and the extinction coefficient increased to 0.3. Thus, it was inadequate as an interference film or a protective film of an optical recording medium.

Example 16 and Example 21

As the raw materials, titanium oxide ($TiO_2$) with an average particle diameter of 3 μm and purity of 4N (99.99%), and cobalt (Co) powder with an average particle diameter of 25 μm and purity of 3N (99.9%) were used. These were blended and mixed to achieve the target compositions shown in Table 3.

1 kg of this mixed powder was mixed using a wet ball mill so that Co is uniformly dispersed in the titanium oxide powder. Subsequently, the mixed powder that was dried by vaporizing moisture was filled in a carbon die and hot pressed. The hot press conditions were 970° C., and bearing of 300 kgf/$cm^2$.

The obtained sintered compact was machined to obtain a target of φ152 mm and 5 mmt. Consequently, targets with density of 95% or higher and specific resistance of 0.06 to 50 Ωcm as shown in Table 3 were obtained.

Subsequently, the sputtering target produced as described above was used to form a sputtered film on a glass substrate. The sputtering conditions were, as shown in Table 3: DC sputtering was performed in an Ar gas atmosphere or Ar gas-$O_2$ (0.5 to 10%) gas atmosphere and at a gas pressure of 0.5 Pa, gas flow rate of 50 sccm, and sputtering power of 500 to 1000 w. Thus, it as possible to perform DC sputtering without any problem, and it was confirmed that the target possesses conductivity. A 1 μm sputtered film was formed on the glass substrate. The deposition rate and composition of the film analyzed with EPMA are respectively shown in Table 3. As Table 3 shows, O/(2Ti+Co) was 0.95 to 1.00. The refractive index and extinction coefficient of the sputtered film were measured. They were measured with an ellipsometer using a light wavelength of 405 nm. The results are similarly shown in Table 3. Consequently, the refractive index was high at 2.61 to 2.67, and the extinction coefficient decreased at 0.01 to 0.1. In all cases it was possible to form an interference film or a protective film suitable for an optical recording medium.

Comparative Example 8 and Comparative Example 9

As the raw materials, titanium oxide ($TiO_2$) with an average particle diameter of 3 μm and purity of 4N (99.99%), and cobalt (Co) powder with an average particle diameter of 20 μm and purity of 3N (99.9%) were used. These were blended and mixed to achieve the target compositions shown in Table 3.

1 kg of this mixed powder was mixed using a wet ball mill so that Co is uniformly dispersed in the titanium oxide powder. Subsequently, the mixed powder that was dried by vaporizing moisture was filled in a carbon die and hot pressed. The hot press conditions were 970° C., and bearing of 300 kgf/$cm^2$.

The obtained sintered compact was machined to obtain a target of φ152 mm and 5 mmt. Consequently, the density was 95% or higher. As shown in Table 3, the specific resistance of the target was 0.002 Ωcm to 6 Ωcm.

Subsequently, the sputtering target produced as described above was used to form a sputtered film on a glass substrate. The sputtering conditions were, as shown in Table 3: DC sputtering was performed in an Ar gas atmosphere or Ar gas-$O_2$ (20%) gas atmosphere and at a gas pressure of 0.5 Pa, gas flow rate of 50 sccm, and sputtering power of 500 to 1000 w. A 1 μm sputtered film was formed on the glass substrate. The deposition rate and composition of the film analyzed with

TABLE 3

| | composition of target | specific resistance | sputter gas | deposition speed (Å/sec/kW) | Ti (at %) | Co (at %) | O (at %) | O/(2Ti + Co) | refractive index | extinction coefficient |
|---|---|---|---|---|---|---|---|---|---|---|
| Example 16 | TiO2:Co = 90:10 at % | 6 Ωcm | Ar—2%O2 | 1.1 | 31.9 | 3.6 | 64.5 | 0.96 | 2.63 | 0.05 |
| Example 17 | TiO2:Co = 95:5 at % | 15 Ωcm | Ar—2%O2 | 1 | 32.7 | 1.7 | 65.6 | 0.98 | 2.62 | 0.03 |
| Example 18 | TiO2:Co = 99:1 at % | 28 Ωcm | Ar—2%O2 | 0.9 | 33.1 | 0.3 | 66.6 | 1.00 | 2.61 | 0.02 |
| Example 19 | TiO2:Co = 99.9:0.1 at % | 50 Ωcm | Ar | 1.6 | 33.3 | 0.04 | 66.66 | 1.00 | 2.61 | 0.01 |
| Example 20 | TiO2:Co = 80:20 at % | 0.1 Ωcm | Ar—10%O2 | 0.5 | 29.6 | 7.3 | 63.1 | 0.95 | 2.67 | 0.1 |
| Example 21 | TiO1.9:Co = 99.99:0.01 at % | 0.06 Ωcm | Ar—0.5%O2 | 1.4 | 33.5 | 0.003 | 66.497 | 0.99 | 2.65 | 0.01 |
| Comparative Example 8 | TiO2:Co = 90:10 at % | 6 Ωcm | Ar | 1.8 | 32.2 | 3.7 | 64.1 | 0.94 | 2.57 | 0.11 |
| Comparative Example 9 | TiO2:Co = 70:30 at % | 0.002 Ωcm | Ar—20%O2 | 0.3 | 28.7 | 12.5 | 58.8 | 0.84 | 2.55 | 0.32 |

EPMA are respectively shown in Table 3. As Table 3 shows, O/(2Ti+Co) was 0.84 to 0.94. The refractive index and extinction coefficient of the sputtered film were measured. They were measured with an ellipsometer using a light wavelength of 405 nm. The results are similarly shown in Table 3.

As a result of the above, Comparative Example 8 did not satisfy the conditions of the present invention since the ratio of oxygen component to metal components, O/(2Ti+Co) was 0.94. Here, the refractive index was low at 2.57, and the extinction coefficient also increased to 0.11. Thus, it was inadequate as an interference film or a protective film of an optical recording medium. Comparative Example 9 did not satisfy the conditions of the present invention since the Co amount was too great at 12.5 at % and the ratio of oxygen component to metal components, O/(2Ti+Co) was 0.84. Here, the refractive index was low at 2.55, and the extinction coefficient also increased to 0.32. Thus, it was inadequate as an interference film or a protective film of an optical recording medium.

Example 22 to Example 26

As the raw materials, titanium oxide ($TiO_2$) with an average particle diameter of 1 μm and purity of 4N (99.99%), and platinum (Pt) powder with an average particle diameter of 7 μm and purity of 3N (99.9%) were used. These were blended and mixed to achieve the target compositions shown in Table 4.

1 kg of this mixed powder was mixed using a wet ball mill so that Pt is uniformly dispersed in the titanium oxide powder. Subsequently, the mixed powder that was dried by vaporizing moisture was filled in a carbon die and hot pressed. The hot press conditions were 1000° C., and bearing of 250 kgf/cm$^2$.

The obtained sintered compact was machined to obtain a target of ϕ152 mm and 5 mmt. Consequently, targets with density of 95% or higher and specific resistance of 0.07 to 50 Ωcm as shown in Table 4 were obtained.

Subsequently, the sputtering target produced as described above was used to form a sputtered film on a glass substrate. There sputtering conditions were, as shown in Table 4: DC sputtering was performed in an Ar gas atmosphere or Ar gas-$O_2$ (1 to 10%) gas atmosphere and at a gas pressure of 0.5 Pa, gas flow rate of 50 sccm, and sputtering power of 500 to 1000 w. Thus, it was possible to perform DC sputtering without any problem, and it was confirmed that the target possesses conductivity.

A 1 μm sputtered film was formed on the glass substrate. The deposition rate and composition of the film analyzed with EPMA are respectively shown in Table 4. As Table 4 shows, O/(2Ti+Pt) was 0.95 to 1.00. The refractive index and extinction coefficient of the sputtered film were measured. They were measured with an ellipsometer using a light wavelength of 405 nm. The results are similarly shown in Table 4.

Consequently, the refractive index was high at 2.62 to 2.74, and the extinction coefficient decreased at 0.008 to 0.1. In all cases it was possible to form an interference film or a protective film suitable for an optical recording medium.

Comparative Example 10 and Comparative Example 11

As the raw materials, titanium oxide ($TiO_2$) with an average particle diameter of 1 μm and purity of 4N (99.99%), and platinum (Pt) powder with an average particle diameter of 7 μm and purity of 3N (99.9%) were used. These were blended and mixed to achieve the target compositions shown in Table 4.

1 kg of this mixed powder was mixed using a wet ball mill so that Pt is uniformly dispersed in the titanium oxide powder. Subsequently, the mixed powder that was dried by vaporizing moisture was filled in a carbon die and hot pressed. The hot press conditions were 1000° C., and bearing of 250 kgf/cm$^2$.

The obtained sintered compact was machined to obtain a target of ϕ152 mm and 5 mmt. Consequently, the density was 95% or higher. As shown in Table 4, the specific resistance of the target was 0.005 Ωcm to 50 Ωcm.

Subsequently, the sputtering target produced as described above was used to form a sputtered film on a glass substrate. There sputtering conditions were, as shown in Table 4: DC sputtering was performed in an Ar gas atmosphere or Ar gas-$O_2$ (20%) gas atmosphere and at a gas pressure of 0.5 Pa, gas flow rate of 50 sccm, and sputtering power of 500 to 1000 w.

A 1 μm sputtered film was formed on the glass substrate. The deposition rate and composition of the film analyzed with EPMA are respectively shown in Table 4. As Table 4 shows, O/(2Ti+Pt) was 0.89 to 0.92. The refractive index and extinction coefficient of the sputtered film were measured. They were measured with an ellipsometer using a light wavelength of 405 nm. The results are similarly shown in Table 4.

As a result of the above, Comparative Example 10 did not satisfy the conditions of the present invention since the ratio of oxygen component to metal components, O/(2Ti+Pt) was 0.92. Here, although the refractive index was high at 2.69, the extinction coefficient increased to 0.21. Thus, it was inadequate as an interference film or a protective film of an optical recording medium.

Comparative Example 11 did not satisfy the conditions of the present invention since the Pt amount was too great at 7.7 at % and the ratio of oxygen component to metal components,

TABLE 4

| | composition of target | specific resistance | sputter gas | deposition speed (Å/sec/kW) | Film Composition | | | | refractive index | extinction coefficient |
| | | | | | Ti (at %) | Pt (at %) | O (at %) | O/(2Ti + Pt) | | |
| --- | --- | --- | --- | --- | --- | --- | --- | --- | --- | --- |
| Example 22 | TiO2:Pt = 85:15 at % | 1 Ωcm | Ar—10%O2 | 0.5 | 30.9 | 5.5 | 63.6 | 0.95 | 2.74 | 0.1 |
| Example 23 | TiO2:Pt = 95:5 at % | 50 Ωcm | Ar—2%O2 | 1.4 | 32.8 | 1.7 | 65.5 | 0.97 | 2.70 | 0.05 |
| Example 24 | TiO2:Pt = 99:1 at % | 6 Ωcm | Ar—2%O2 | 1.3 | 33.2 | 0.4 | 66.4 | 0.99 | 2.65 | 0.02 |
| Example 25 | TiO2:Pt = 99.9:0.1 at % | 10 Ωcm | Ar | 2 | 33.2 | 0.04 | 66.76 | 1.00 | 2.64 | 0.01 |
| Example 26 | TiO1.9:Pt = 99.99:0.01 at % | 0.07 Ωcm | Ar—1%O2 | 1.4 | 33.3 | 0.004 | 66.696 | 1.00 | 2.62 | 0.008 |
| Comparative example 10 | TiO2:Pt = 95:5 at % | 50 Ωcm | Ar | 2.3 | 34 | 1.8 | 64.2 | 0.92 | 2.69 | 0.21 |
| Comparative example 11 | TiO2:Pt = 80:20 at % | 0.005 Ωcm | Ar—20%O2 | 0.4 | 30.8 | 7.7 | 61.5 | 0.89 | 2.65 | 0.4 |

O/(2Ti+Pt) was 0.89. Here, although the refractive index was high at 2.65, the extinction coefficient increased to 0.4. Thus, it was inadequate as an interference film or a protective film of an optical recording medium.

Example 27 to Example 32

As the raw materials, titanium oxide ($TiO_2$) with an average particle diameter of 1 μm and purity of 4N (99.99%), and nickel (Ni) powder with an average particle diameter of 20 μm and purity of 3N (99.9%) were used. These were blended and mixed to achieve the target compositions shown in Table 5.

1 kg of this mixed powder was mixed using a wet ball mill so that Ni is uniformly dispersed in the titanium oxide powder. Subsequently, the mixed powder that was dried by vaporizing moisture was filled in a carbon die and hot pressed. The hot press conditions were 1000° C., and bearing of 250 kgf/$cm^2$.

The obtained sintered compact was machined to obtain a target of φ152 mm and 5 mmt. Consequently, targets with density of 95% or higher and specific resistance of 0.06 to 37 Ωcm as shown in Table 5 were obtained.

Subsequently, the sputtering target produced as described above was used to form a sputtered film on a glass substrate. The sputtering conditions were, as shown in Table 5: DC sputtering was performed in an Ar gas atmosphere or Ar gas-$O_2$ (0.5 to 10%) gas atmosphere and at a gas pressure of 0.5 Pa, gas flow rate of 50 sccm, and sputtering power of 500 to 1000 w. Thus, it as possible to perform DC sputtering without any problem, and it was confirmed that the target possesses conductivity. A 1 μm sputtered film was formed on the glass substrate. The deposition rate and composition of the film analyzed with EPMA are respectively shown in Table 5. As Table 5 shows, O/(2Ti+Ni) was 0.96 to 1.00. The refractive index and extinction coefficient of the sputtered film were measured. They were measured with an ellipsometer using a light wavelength of 405 nm. The results are similarly shown in Table 5. Consequently, the refractive index was high at 2.61 to 2.68, and the extinction coefficient decreased at 0.008 to 0.1. In all cases it was possible to form an interference film or a protective film suitable for an optical recording medium.

Comparative Example 12 and Comparative Example 13

As the raw materials, titanium oxide ($TiO_2$) with an average particle diameter of 1 μm and purity of 4N (99.99%), and nickel (Ni) powder with an average particle diameter of 7 μm and purity of 3N (99.9%) were used. These were blended and mixed to achieve the target compositions shown in Table 5.

1 kg of this mixed powder was mixed using a wet ball mill so that Ni is uniformly dispersed in the titanium oxide powder. Subsequently, the mixed powder that was dried by vaporizing moisture was filled in a carbon die and hot pressed. The hot press conditions were 1000° C., and bearing of 250 kgf/$cm^2$.

The obtained sintered compact was machined to obtain a target of φ152 mm and 5 mmt. Consequently, the density was 95% or higher. As shown in Table 5, the specific resistance of the target was 0.005 Ωcm to 11 Ωcm.

Subsequently, the sputtering target produced as described above was used to form a sputtered film on a glass substrate. The sputtering conditions were, as shown in Table 5: DC sputtering was performed in an Ar gas atmosphere or Ar gas-$O_2$ (20%) gas atmosphere and at a gas pressure of 0.5 Pa, gas flow rate of 50 sccm, and sputtering power of 500 to 1000 w. A 1 μm sputtered film was formed on the glass substrate. The deposition rate and composition of the film analyzed with EPMA are respectively shown in Table 5. As Table 5 shows, O/(2Ti+Ni) was 0.83 to 0.93. The refractive index and extinction coefficient of the sputtered film were measured. They were measured with an ellipsometer using a light wavelength of 405 nm. The results are similarly shown in Table 5.

As a result of the above, Comparative Example 12 did not satisfy the conditions of the present invention since the ratio of oxygen component to metal components, O/(2Ti+Ni) was 0.93. Here, the refractive index was low at 2.58, and the extinction coefficient also increased to 0.15. Thus, it was inadequate as an interference film or a protective film of an optical recording medium. Comparative Example 13 did not satisfy the conditions of the present invention since the Ni amount was too great at 12.5 at % and the ratio of oxygen component to metal components, O/(2Ti+Ni) was 0.83. Here, the refractive index was low at 2.54, and the extinction coefficient increased to 0.35. Thus, it was inadequate as an interference film or a protective film of an optical recording medium.

Example 33 to Example 38

As the raw materials, titanium oxide ($TiO_2$) with an average particle diameter of 3 μm and purity of 4N (99.99%), and gold (Au) powder with an average particle diameter of 20 μm and purity of 3N (99.9%) were used. These were blended and mixed to achieve the target compositions shown in Table 6.

1 kg of this mixed powder was mixed using a wet ball mill so that Au is uniformly dispersed in the titanium oxide powder. Subsequently, the mixed powder that was dried by vapor-

TABLE 5

| | | | | | Film Composition | | | | | |
| | composition of target | specific resistance | sputter gas | deposition speed (Å/sec/kW) | Ti (at %) | Ni (at %) | O (at %) | O/(2Ti + Ni) | refractive index | extinction coefficient |
| --- | --- | --- | --- | --- | --- | --- | --- | --- | --- | --- |
| Example 27 | TiO2:Ni = 90:10 at % | 11 Ωcm | Ar—4%O2 | 0.6 | 31.9 | 3.5 | 64.6 | 0.96 | 2.65 | 0.08 |
| Example 28 | TiO2:Ni = 95:5 at % | 22 Ωcm | Ar—2%O2 | 0.9 | 32.8 | 1.8 | 65.4 | 0.97 | 2.63 | 0.04 |
| Example 29 | TiO2:Ni = 99:1 at % | 37 Ωcm | Ar—2%O2 | 0.8 | 33.2 | 0.4 | 66.4 | 0.99 | 2.62 | 0.01 |
| Example 30 | TiO2:Ni = 99.9:0.1 at % | 8 Ωcm | Ar | 1.6 | 33.3 | 0.04 | 66.66 | 1.00 | 2.61 | 0.008 |
| Example 31 | TiO2:Ni = 80:20 at % | 0.2 Ωcm | Ar—10%O2 | 0.4 | 29.5 | 7.2 | 63.3 | 0.96 | 2.68 | 0.1 |
| Example 32 | TIO1.9:Ni = 99.99:0.01 at % | 0.06 Ωcm | Ar—0.5%O2 | 1.3 | 33.5 | 0.004 | 66.496 | 0.99 | 2.66 | 0.02 |
| Comparative Example 12 | TiO2:Ni = 90:10 at % | 11 Ωcm | Ar | 1.8 | 32.3 | 3.8 | 63.9 | 0.93 | 2.58 | 0.15 |
| Comparative Example 13 | TiO2:Ni = 70:30 at % | 0.005 Ωcm | Ar—20%O2 | 0.3 | 28.9 | 12.5 | 58.6 | 0.83 | 2.54 | 0.35 | izing moisture was filled in a carbon die and hot pressed. The hot press conditions were 950° C., and bearing of 350 kgf/cm².

The obtained sintered compact was machined to obtain a target of φ152 mm and 5 mmt. Consequently, targets with density of 95% or higher and specific resistance of 0.06 to 51 Ωcm as shown in Table 6 were obtained.

Subsequently, the sputtering target produced as described above was used to form a sputtered film on a glass substrate. There sputtering conditions were, as shown in Table 6: DC sputtering was performed in an Ar gas atmosphere or Ar gas-$O_2$ (20%) gas atmosphere and at a gas pressure of 0.5 Pa, gas flow rate of 50 sccm, and sputtering power of 500 to 1000 w.

TABLE 6

|  | composition of target | specific resistance | sputter gas | deposition speed (Å/sec/kW) | Film Composition | | | | refractive index | extinction coefficient |
|---|---|---|---|---|---|---|---|---|---|---|
|  |  |  |  |  | Ti (at %) | Au (at %) | O (at %) | O/(2Ti + Au) |  |  |
| Example 33 | TiO2:Au = 90:10 at % | 18 Ωcm | Ar—4%O2 | 0.8 | 31.9 | 3.6 | 64.5 | 0.96 | 2.69 | 0.09 |
| Example 34 | TiO2:Au = 95:5 at % | 35 Ωcm | Ar—2%O2 | 1 | 32.8 | 1.7 | 65.5 | 0.97 | 2.66 | 0.06 |
| Example 35 | TiO2:Au = 99:1 at % | 51 Ωcm | Ar—2%O2 | 0.8 | 33.2 | 0.4 | 66.4 | 0.99 | 2.64 | 0.02 |
| Example 36 | TiO2:Au = 99.9:0.1 at % | 7 Ωcm | Ar | 1.5 | 33.3 | 0.04 | 66.66 | 1.00 | 2.62 | 0.007 |
| Example 37 | TiO2:Au = 80:20 at % | 0.6 Ωcm | Ar—10%O2 | 0.4 | 29.3 | 7.5 | 63.2 | 0.96 | 2.70 | 0.1 |
| Example 38 | TiO1.9:Au = 99.99:0.01 at % | 0.06 Ωcm | Ar—0.5%O2 | 1.5 | 33.4 | 0.004 | 66.596 | 1.00 | 2.65 | 0.01 |
| Comparative example 14 | TiO2:Au = 95:5 at % | 35 Ωcm | Ar | 1.9 | 34 | 1.8 | 64.2 | 0.92 | 2.60 | 0.13 |
| Comparative example 15 | TiO2:Au = 70:30 at % | 0.01 Ωcm | Ar—20%O2 | 0.3 | 29.1 | 12.5 | 58.4 | 0.83 | 2.56 | 0.32 |

Subsequently, the sputtering target produced as described above was used to form a sputtered film on a glass substrate. The sputtering conditions were, as shown in Table 6: DC sputtering was performed in an Ar gas atmosphere or Ar gas-$O_2$ (0.5 to 10%) gas atmosphere and at a gas pressure of 0.5 Pa, gas flow rate of 50 sccm, and sputtering power of 500 to 1000 w. Thus, it as possible to perform DC sputtering without any problem, and it was confirmed that the target possesses conductivity. A 1 μm sputtered film was formed on the glass substrate. The deposition rate and composition of the film analyzed with EPMA are respectively shown in Table 6. As Table 6 shows, O/(2Ti+Au) was 0.96 to 1.00. The refractive index and extinction coefficient of the sputtered film were measured. They were measured with an ellipsometer using a light wavelength of 405 nm. The results are similarly shown in Table 6. Consequently, the refractive index was high at 2.62 to 2.70, and the extinction coefficient decreased at 0.007 to 0.1. In all cases it was possible to form an interference film or a protective film suitable for an optical recording medium.

Comparative Example 14 and Comparative Example 15

As the raw materials, titanium oxide ($TiO_2$) with an average particle diameter of 3 μm and purity 4N (99.99%), and gold (Au) powder with an average particle diameter of 20 μm and purity 3N (99.9%) were used. These were blended and mixed to achieve the target compositions shown in Table 6. 1 kg of this mixed powder was mixed using a wet ball mill so that Au is uniformly dispersed in the titanium oxide powder. Subsequently, the mixed powder that was dried by vaporizing moisture was filled in a carbon die and hot pressed. The hot press conditions were 950° C., and bearing of 350 kgf/cm². The particle size of the raw materials, hot press conditions, bearing, and particle size of the Au phase in the target of Comparative Example 14 and Comparative Example 15 are similarly shown in Table 6. The obtained sintered compact was machined to obtain a target of φ152 mm and 5 mmt. Consequently, the density was 95% or higher. As shown in Table 6, the specific resistance of the target was 0.01 Ωcm to 35 Ωcm.

A 1 μm sputtered film was formed on the glass substrate. The deposition rate and composition of the film analyzed with EPMA are respectively shown in Table 6. As Table 6 shows, O/(2Ti+Au) was 0.83 to 0.92. The refractive index and extinction coefficient of the sputtered film were measured. They were measured with an ellipsometer using a light wavelength of 405 nm. The results are similarly shown in Table 6.

As a result of the above, Comparative Example 14 did not satisfy the conditions of the present invention since the ratio of oxygen component to metal components, O/(2Ti+Au) was 0.92. Here, although the refractive index was high at 2.60, and the extinction coefficient increased to 0.13. Thus, it was inadequate as an interference film or a protective film of an optical recording medium. Comparative Example 15 did not satisfy the conditions of the present invention since the Au amount was too great at 12.5 at % and the ratio of oxygen component to metal components, O/(2Ti+Au) was 0.83. Here, the refractive index was low at 2.56, and the extinction coefficient increased to 0.32. Thus, it was inadequate as an interference film or a protective film of an optical recording medium.

Summary of Examples and Comparative Examples

Among the foregoing Examples and Comparative Examples, those within the scope of the present invention all had a high refractive index and low extinction coefficient. Similarly, with respect to those in which the respective components of the sputtering target satisfied the conditions of the present invention, the specific resistance of the target was 100 Ωcm or less in all cases, and favorable results were yielded in that an abnormal discharge could not be observed.

This invention provides a thin film comprising titanium oxide as its main component with a high refractive index and low extinction coefficient and a sintered compact sputtering target comprising titanium oxide as its main component which is suitable for producing the foregoing thin film, and the thin film obtained with the present invention can be used as a film or layer of an optical information recording medium of electronic parts such as CDs and DVDs.

Moreover, the thin film of the present invention yields superior transmittance and low reflectance and is particularly effective as an interference film or protective film of an optical information recording medium. A high melting point dielectric protective layer has tolerance against repeated thermal stress by warming and cooling, and is effective as a dielectric protective layer in which the foregoing thermal effect does not affect the reflective film or other locations, which itself is thin, has low reflectance, and which requires strength that is free from deterioration.

In addition, a material possessing the foregoing characteristics can be applied to architectural glass, glass for automobiles, CRT, and flat displays; that is, it can be used as a heat ray reflective film, antireflection film, and interference filter.

The invention claimed is:

1. An optical interference film or a protective film of an optical information recording medium which is formed by performing DC sputtering to a target comprising titanium oxide as its main component, wherein the film includes titanium, oxygen and copper, content of Ti is 29.0% or higher and 34.0 at % or less and content of Cu is 0.003 at % or higher and 7.7 at % or less with the remainder being oxygen and unavoidable impurities, and ratio of oxygen component to metal components, O/(2Ti+0.5Cu), is 0.96 or higher, and wherein a refractive index of the film in a wavelength region of 400 to 410 nm is 2.60 or higher.

2. The film according to claim 1, wherein an extinction coefficient of the film in a wavelength region of 400 to 410 nm is 0.1 or less.

3. The film according to claim 2, wherein the extinction coefficient in the wavelength region of 400 to 410 nm is 0.05 or less.

4. The film according to claim 1, wherein the film is amorphous.

5. A sintered compact target for DC sputtering for forming an optical interference film or a protective film of an optical information recording medium comprising titanium oxide as its main component, wherein the target includes copper and comprises, as its main component, titanium oxide made of titanium, oxygen and unavoidable impurities as a remainder thereof, the respective components have a composition ratio of $(TiO_{2-m})_{1-n}Cu_n$ provided that $0 \leq m \leq 0.5$ and $0.0001 \leq n \leq 0.2$, and the target has a specific resistance of 100 Ω/cm or less.

6. An optical interference or protective film of an optical information recording medium, comprising:
    an amorphous film having titanium oxide as its main component;
    the amorphous film including titanium, oxygen and copper with a content of Ti being 29.0% to 34.0 at %, a content of Cu being 0.003 at % to 7.7 at %, and a remainder being oxygen and unavoidable impurities; and
    the amorphous film having a ratio of oxygen component to metal components, O/(2Ti+0.5Cu), of 0.96 or higher.

7. The optical interference or protective film according to claim 6, wherein a refractive index of the amorphous film in a wavelength region of 400 to 410 nm is 2.60 or higher.

8. The optical interference or protective film according to claim 7, wherein an extinction coefficient of the amorphous film in a wavelength region of 400 to 410 nm is 0.1 or less.

9. The optical interference or protective film according to claim 7, wherein an extinction coefficient of the amorphous film in a wavelength region of 400 to 410 nm is 0.05 or less.

* * * * *